United States Patent
Okamoto et al.

(10) Patent No.: US 6,265,288 B1
(45) Date of Patent: Jul. 24, 2001

(54) METHOD OF MANUFACTURING SILICON-BASED THIN-FILM PHOTOELECTRIC CONVERSION DEVICE

(75) Inventors: Yoshifumi Okamoto, Otsu; Masashi Yoshimi, Kobe, both of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/390,085

(22) Filed: Sep. 3, 1999

(30) Foreign Application Priority Data

| Oct. 12, 1998 | (JP) | 10-289138 |
| Dec. 9, 1998 | (JP) | 10-349714 |
| Feb. 26, 1999 | (JP) | 11-050147 |
| Feb. 26, 1999 | (JP) | 11-050148 |

(51) Int. Cl.$^7$ ............... H01L 21/20; H01L 21/36
(52) U.S. Cl. ............... 438/485; 438/96; 438/97; 438/482; 438/488; 136/255; 136/258
(58) Field of Search ............... 438/96, 97, 482, 438/485, 488; 136/255, 256, 258

(56) References Cited

U.S. PATENT DOCUMENTS

| 4,433,202 | * | 2/1984 | Maruyama et al. | 136/255 |
| 4,842,897 | * | 6/1989 | Takeuchi et al. | 136/258 |

FOREIGN PATENT DOCUMENTS

| 02014011 | * | 1/1990 | (JP) | 136/243 |
| 4137725 | | 5/1992 | (JP) | |

OTHER PUBLICATIONS

"Complete Microcrystalline p–i–n Solar Cell–Crystalline or Amorphous Cell Behavior?", Appl. Phys. Lett. 65(7), p 860–862, 1994.*

Meier, J., et al., "Complete microcrystalline p–i–n solar cell–Crystalline or amorphous cell behavior?", Appl. Phys. Lett., 65, (7), Aug. 15, 1994, 860–862.

* cited by examiner

Primary Examiner—Charles Bowers
Assistant Examiner—Asok K. Sarkar
(74) Attorney, Agent, or Firm—Hogan & Hartson L.L.P.

(57) ABSTRACT

A method of fabricating a silicon-based thin-film photoelectric conversion device, where a plasma CVD process is used to deposit a polycrystalline photoelectric conversion layer. During the deposition of the photoelectric conversion layer, the temperature of the underlying layer is less than 550° C., the pressure in the plasma chamber is more than 5 Torr, and the ratio of the flow rates of a hydrogen gas and a silane-type gas is more than 50. In addition, one of the following operations is carried out during the deposition to change the relevant parameters between the start and end of the deposition. First, the distance between the plasma discharge electrodes is increased gradually or in steps. Second, the pressure of the reaction chamber is increased gradually or in steps. Third, the flow rate of the silane-type gas is increased gradually. Fourth, the plasma discharge power density is reduced gradually or in steps.

15 Claims, 2 Drawing Sheets

METHOD OF MANUFACTURING SILICON-BASED THIN-FILM PHOTOELECTRIC CONVERSION DEVICE

BACKGROUND OF THE INVENTION

1. Field of the Invention

The present invention relates to thin film photoelectric conversion devices and methods of manufacturing the same and in particular to reducing the cost of the same and improving the performance of the same. It should be noted that in the present specification the terms "polycrystalline", "microcrystalline" and "crystalline" are intended to also mean partially amorphous state, as normally used in the technical field of thin film photoelectric conversion devices.

2. Description of the Related Art

An amorphous silicon based solar cell is a typical thin film photoelectric conversion device. An amorphous photoelectric conversion material is usually prepared by a plasma CVD method at a film-forming temperature as low as about 200° C., so that it can be formed on an inexpensive substrate, e.g., of glass, stainless steel, organic film, and thus expected as a preferable material for low-cost photoelectric conversion devices. Furthermore, since amorphous silicon has a large absorption coefficient for the visible-light range, a solar cell using an amorphous photoelectric conversion layer of a thickness less than 500 nm has achieved a short-circuit current more than 15 mA/cm$^2$.

However, an amorphous silicon based material has a photoelectric conversion characteristic which tends to be disadvantageously degraded when it is irradiated with light for a long time period, as is referred to as the Stebler-Wronskey effect. Furthermore, its effective optical sensitivity range is limited to about 800 nm at the longer wavelength side. Therefore, a photoelectric conversion device using the amorphous silicon based material is rather limited in reliability, performance and the like, and its advantages, i.e., the high degree of freedom in substrate selection, the capability of applying low-cost process, and the like, are not fully made use of In contrast, in recent years a photoelectric conversion device employing a thin film containing crystalline silicon such as polycrystalline silicon or microcrystalline silicon, has been increasingly developed. It has been developed in attempting to reduce the cost of the photoelectric conversion device and also enhance the performance of the same by forming a crystalline silicon thin film of good quality on an inexpensive substrate through a process at a low temperature, and such development is expected to be applied to a variety of photoelectric conversion devices, such as optical sensors other than solar cells.

Such crystalline silicon thin films may be formed, e.g., by employing chemical vapor deposition (CVD), sputtering or the like to deposit the same directly on a substrate or by employing a similar process to initially deposit an amorphous film and then thermally annealing or laser-annealing the film to achieve crystallization thereof. At any rate, it should be processed at most 550° C. if such an inexpensive substrate as described above is used.

Among such processes, the technique of employing a plasma CVD method to directly deposit a crystalline silicon thin film most readily allows the process to be performed at low temperatures and the thin film to be increased in area, and is also expected to relatively readily provide a film of high quality. In employing such technique to obtain a polycrystalline silicon thin film, a crystalline silicon thin film of high quality is initially formed on a substrate through some process and then it can be used as a seed layer or a crystallization control layer so as to form thereon a polycrystalline silicon thin film of good quality even at relatively low temperatures.

It is also well known that a silane-type material gas may be diluted no less than 10 times with hydrogen and a pressure of 10 mTorr to 1 Torr may also be set in a plasma reaction chamber when a plasma CVD method is employed in film deposition to obtain a microcrystalline silicon thin film. In this example, a microcrystalline silicon thin film can readily be obtained at a temperature around 200° C. For example, a photoelectric conversion device including a photoelectric conversion unit comprised of a p-i-n junction of microcrystalline silicon is described in Appl. Phys. Lett., Vol. 65, 1994, p. 860. This photoelectric conversion unit is formed of a p-type semiconductor layer, an i-type semiconductor layer as a photoelectric conversion layer and an n-type semiconductor layer which are successively simply deposited by a plasma CVD method and it is characterized in that these semiconductor layers are all of microcrystalline silicon. However, if a crystalline silicon film of high quality and hence a silicon-based thin-film photoelectric conversion device of high performance are formed according to conventional manufacturing methods, conditions and the like, the film deposition rate is as low as less than 0.6 μm/hr in the thickness direction, equal to or lower than a deposition rate of an amorphous silicon film.

Japanese Patent Laying-Open No. 4-137725 describes that a low-temperature plasma CVD method is employed at a relatively high pressure of 5 Torr to form a silicon film. This example is, however, a comparative example with respect to the invention disclosed in Japanese Patent Laying-Open No. 4-137725, describing deposition of a silicon thin film directly on a substrate, e.g., of glass. The obtained film in the comparative example has low quality, not applicable to a photoelectric conversion device.

In general, when a plasma CVD method is employed at high pressures, a large amount of powdery products, dust and the like are produced in the plasma reaction chamber. Consequently, it is highly possible that the dust and the like fly onto a surface of the growing film and are thus taken into the growing film. As a result, the dust and the like may create pinholes in the film. To reduce such degradation in film quality, the reaction chamber must be cleaned frequently. The increased pressure in the reaction chamber renders such problems more significant particularly when a temperature lower than 550° C. is used as a film deposition condition. In addition, in manufacturing a photoelectric conversion device such as a solar cell, it is necessary to deposit a thin film of large area and thus the increased pressure tends to disadvantageously reduce product yield and increases the labor and cost for maintenance of the film forming apparatus.

Accordingly, conventionally a pressure less than 1 Torr has typically been used, as described above, in employing a plasma CVD method to manufacture a thin film photoelectric conversion device.

A polycrystalline-type photoelectric conversion device including a crystalline silicon-based thin-film photoelectric conversion layer as described above has the following disadvantage: whether polycrystalline silicon or microcrystalline silicon partially containing amorphous phase is used as a photoelectric conversion layer of a solar cell, the silicon layer used is required to have a thickness as much as several micrometers to several tens micrometers to sufficiently absorb sunlight, considering the absorption coefficient of the crystalline silicon. It is thicker than an amorphous silicon photoelectric conversion layer by as much as close to one digit to two digits.

When according to conventional technology a plasma CVD method is used at low temperatures to obtain a crystalline silicon based thin film of good quality, the film grows at a rate approximately equal to or lower than a growth rate of an amorphous silicon film, e.g., approximately only 0.6 µm/hr, even with temperature, pressure in the reaction chamber, RF power, gas flow rate and other various parameters for film-forming conditions that are preferably determined. In other words, the film deposition time required for forming a crystalline silicon thin film photoelectric conversion layer is several times to several tens times longer than that required for forming an amorphous silicon photoelectric conversion layer. This will render it difficult to enhance the throughput in the process for manufacturing the photoelectric conversion device and thus prevent the cost of the same from being reduced.

SUMMARY OF THE INVENTION

In view of such conventional techniques as described above, an object of the present invention is to increase a deposition rate for a crystalline silicon-based photoelectric conversion layer formed by a low-temperature plasma CVD method to enhance a throughput in the process for manufacturing a photoelectric conversion device and to improve the performance of the same.

In a method of manufacturing a silicon-based thin-film photoelectric conversion device of the present invention, the photoelectric conversion device includes at least one photoelectric conversion unit formed on a substrate and including a semiconductor layer of a first conductivity type, a crystalline silicon-based thin-film photoelectric conversion layer, and a semiconductor layer of an opposite conductivity type that are successively deposited by a plasma CVD method, wherein when the photoelectric conversion layer is deposited by the plasma CVD method: an underlying layer has a temperature lower than 550° C.; a plasma reaction chamber has a pressure of at least 5 Torr therein; a gas introduced into the reaction chamber contains a silane-type gas and hydrogen gas as its main components, with the hydrogen gas at least 50 times larger in flow rate than the silane-type gas; and at least one operation is carried out selected from the group of the following four operations, i.e., operation (a) of increasing a distance between plasma discharge electrodes so that the inter-electrode distance is at most one centimeter larger when the photoelectric conversion layer has been completely deposited than when the photoelectric conversion layer starts to be deposited, the inter-electrode distance being increased gradually or in steps after the photoelectric conversion layer has been deposited to 20 to 80% of its final thickness, operation (b) of providing in the reaction chamber a first pressure of more than 5 Torr when the photoelectric conversion layer starts to be deposited and also increasing the pressure gradually or in steps to a second pressure until the photoelectric conversion layer is completely deposited, operation (c) of providing the silane-type gas of a flow rate 1.1 to 1.5 times larger when the photoelectric conversion layer has been completely deposited than when the photoelectric conversion layer starts to be deposited, the flow rate of the silane-type gas being gradually increased for more than half a time required for depositing the photoelectric conversion layer, and operation (d) of providing a plasma discharging power density of more than 100 mW/cm², the plasma discharging power density being at most 15% smaller when the photoelectric conversion layer has been completely deposited than when the photoelectric conversion layer starts to be deposited, the plasma discharging power density being reduced gradually or in steps after the photoelectric conversion layer has been deposited to 20 to 80% of its final thickness.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
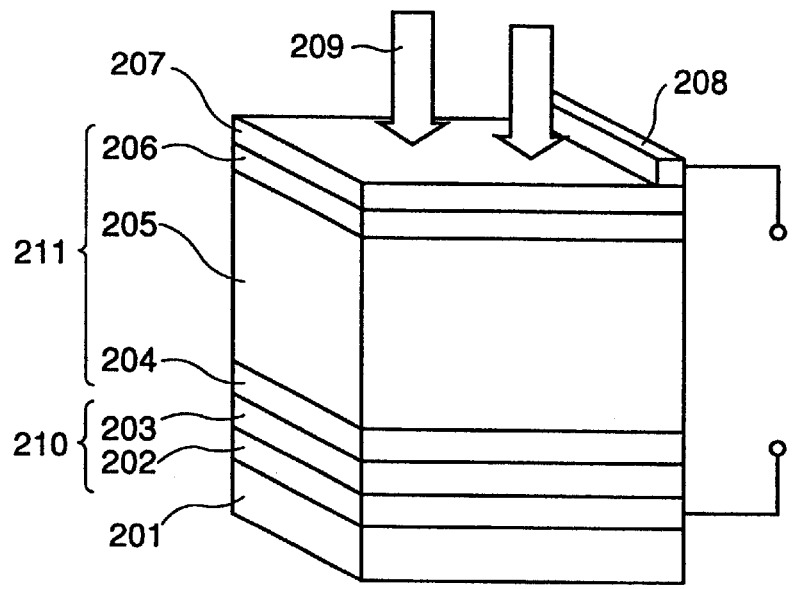
FIG. 1 is a schematic perspective view of a silicon-based thin-film photoelectric conversion device of a polycrystalline type according to a first embodiment of the present invention.

In a silicon-based thin-film photoelectric conversion device of FIG. 1 to be manufactured according to a first embodiment of the present invention, a substrate 201 of the photoelectric conversion device can be formed, e.g., of metal such as stainless steel, organic film, inexpensive glass having a low melting point.

A back electrode 210 on substrate 201 can be formed through vapor deposition, sputtering or the like, including at least one of the following thin films (A) and (B):

(A) a thin metal film including a layer of a metal selected from Ti, Cr, Al, Ag, Au, Cu and Pt or an alloy thereof; and (B) a transparent conductive thin film including a layer containing an oxide selected from ITO, $SnO_2$ and ZnO.

On back electrode 210, a semiconductor layer 204 of a first conductivity type in a photoelectric conversion unit 211 is deposited by a plasma CVD method. Semiconductor layer 204 of the first conductivity type can be, e.g., an n-type silicon layer doped with more than 0.01 at. % phosphorus as a conductivity-type determining impurity or a p-type silicon layer doped with more than 0.01 at. % boron. However, the impurity atoms for semiconductor layer 204 of the first conductivity type are not limited to the above ones. For example, those for a p-type silicon layer may also be aluminum and the like. Further, semiconductor layer 204 may also be formed of an alloy material such as silicon carbide or silicon germanium. Silicon-based thin film 204 of the first conductivity type may be polycrystalline, microcrystalline or amorphous and has a thickness set in a range of 1 to 100 nm, more preferably 2 to 30 nm.

A photoelectric conversion layer 205 of a crystalline silicon-based thin film can be of a non-doped i-type polycrystalline silicon thin film or an i-type microcrystalline silicon thin film with an at least 80% crystallized volume fraction, or a silicon-based thin film material of weak p- or n-type containing a small amount of impurity and having sufficient photoelectric conversion efficiency. However, photoelectric conversion layer 205 is also not limited to such materials as above and may be of an alloy material such as silicon carbide or silicon germanium. Photoelectric conversion layer 205 has a thickness in a range from 0.5 to 20 μm necessary and sufficient for acting as a crystalline silicon thin film photoelectric conversion layer.

Crystalline silicon-based photoelectric conversion layer 205 can be formed by the typical, commonly used, diode parallel plate RF plasma CVD method, and it may also have the films formed by a plasma CVD method using a high frequency power supply of the RF band to the VHF band with a frequency lower than 150 MHz.

It should be noted that in such plasma CVD methods, crystalline silicon-based photoelectric conversion layer 205 is formed at a temperature lower than 550° C., which temperature allows such inexpensive substrates described above to be used.

In depositing crystalline silicon-based thin-film photoelectric conversion layer 205, a pressure of at least 5 Torr is set in a plasma CVD reaction chamber, and a high frequency power density of at least 100 mW/cm² is also set preferably. Furthermore, a gas introduced into the reaction chamber contains a silane-type gas and hydrogen gas as its main components, with the hydrogen gas having a flow rate preferably at least 50 times, more preferably at least 100 times larger than that of the silane-type gas. Furthermore, one operation is carried out, selected from the group of the following four operations (a) to (d).

In operation (a), a distance between plasma discharge electrodes is preferably increased so that it is at most one centimeter larger when photoelectric conversion layer 205 has been completely deposited than when the layer starts to be deposited and the inter-electrode distance is preferably increased gradually or in steps after the photoelectric conversion layer has been deposited to 20 to 80% of its final thickness, so that the inter-electrode distance can be optimally maintained for the crystal growth in photoelectric conversion layer 205 to thereby increase an open-circuit voltage $V_{OC}$ of a photoelectric conversion device to be obtained. Increasing the inter-electrode distance serves to enhance the uniformity of a film deposited and also effectively further reduces film damage caused by plasma.

Figure 3:
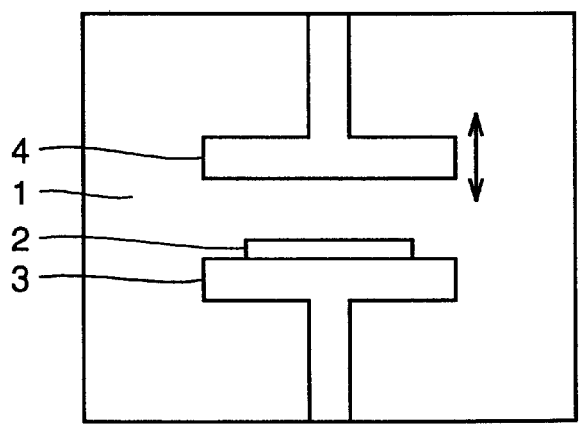
FIG. 3 is a schematic cross section of a single plasma CVD chamber including a movable plasma discharge electrode.
Figure 4:
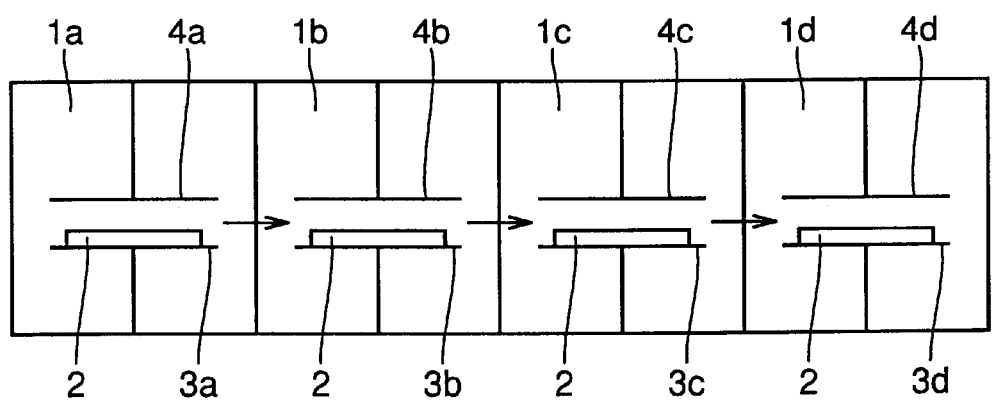
FIG. 4 is a schematic cross section of a plasma CVD apparatus of an in-line type with a different inter-electrode distance set for each chamber.

If photoelectric conversion layer 205 is deposited in a single plasma CVD chamber, a movable electrode can be used to increase the distance between the electrodes. For example, as shown in the schematic cross section of FIG. 3, in a chamber 1 at least one of electrodes 3 supporting a substrate 2 and a counter electrode 4 opposite thereto may be movable as indicated by the arrow in the figure. If photoelectric conversion layer 205 is deposited in a plasma CVD apparatus of an in-line system with multiple chambers linked in series, each chamber may have a different inter-electrode distance. For example, as shown in the schematic cross section of FIG. 4, a plurality of serially arranged chambers 1a to 1d, through which substrate 2 is forwarded as indicated by the arrows, may have therein their respective substrate supporting electrodes 3a to 3d and counter electrodes 4a to 4d such that a substrate supporting electrode and a counter electrode in a chamber are spaced farther apart than those in the immediately preceding chamber are. The inter-electrode distance may also be set varied for each chamber in a plasma CVD apparatus of a multi-chamber type with a hermetic intermediate chamber surrounded by and coupled with a plurality of separate plasma CVD chambers. If multiple substrates are placed on and moved by a single electrode in the form of a conveyor belt, a strip electrode or multiple plate electrodes may be provided opposite to the conveyor-belt electrode with the inter-electrode distance, increased gradually or in steps.

In operation (b), to deposit crystalline silicon based thin film photoelectric conversion layer 205, a first pressure of more than 5 Torr is set in the plasma CVD reaction chamber in starting the deposition of photoelectric conversion layer 205 and the pressure is increased gradually or in steps to a second pressure until layer 205 is completely deposited, so that the pressure in the reaction chamber can be maintained optimally for the crystal growth in photoelectric conversion layer 205 to increase open-circuit voltage $V_{OC}$ of a photoelectric conversion device to be obtained. Preferably a high frequency power density of more than 100 mW/cm² is provided during optimally maintaining the pressure in the reaction chamber.

In operation (c), the silane-type gas is provided with a flow rate 1.1 to 1.5 times larger when photoelectric conversion layer 205 has been completely deposited than when photoelectric conversion layer 205 starts to be deposited. While the flow rate may be increased gradually or in steps, preferably it is increased gradually over more than half a time required for depositing photoelectric conversion layer 205, so that the flow rate of the silane-type gas can be maintained optimally for the crystal growth in photoelectric conversion layer 205 to increase open-circuit voltage $V_{OC}$ of a photoelectric conversion device to be obtained. Furthermore, the deposition rate is expected to further increase as the flow rate of the silane-type gas to hydrogen is increased.

In operation (d), a plasma discharging power density employed in the deposition of photoelectric conversion layer 205 is reduced so that it is at most 15% smaller when photoelectric conversion layer 205 has been completely deposited than when photoelectric conversion layer 205 starts to be deposited. Preferably the plasma discharging power density is reduced gradually or in steps after photoelectric conversion layer 205 has been deposited to 20 to 80% of its final thickness, so that the plasma discharging power density can be maintained optimally for the crystal growth in photoelectric conversion layer 205 to increase open-circuit voltage $V_{OC}$ of a photoelectric conversion device to be obtained. Furthermore the reduction of the plasma discharging power density can also effectively reduce plasma-caused damage to the film that has already been deposited.

The silane-type gas used is, e.g., preferably monosilane or disilane, though it may be used together with silicon halide gas, such as silicon tetrafluoride, silicon tetrachloride or dichlorosilane. It may also be used together with inert gas such as noble gas, preferably helium, neon, argon or the like. Under such conditions as above, crystalline silicon-based photoelectric conversion layer 205 can be grown at a deposition rate more than 1 μm/hr.

Most of the crystal grains in crystalline silicon-based thin-film photoelectric conversion layer 205 grow upward, extending like columns from underlying layer 204. It is preferable that these crystal grains have a preferential crystal orientation plane of (110) parallel to a surface of the film. Even if layer 204 of the first conductivity type as the underlying layer has a substantially flat surface geometry, photoelectric conversion layer 205 grown thereon has an uneven surface texture with fine protrusions or depressions having a spacing therebetween smaller than its film thickness by approximately one digit.

The resultant crystalline silicon-based thin film 205 preferably has a hydrogen content of 0.5 to 30 at. %, more preferably 1–20 at. % according to secondary ion mass spectroscopy.

In accordance with the present invention, since crystalline silicon-based thin-film photoelectric conversion layer 205 is grown at a pressure higher than the conventional pressure of less than 1 Torr, ion-caused damage in the film can be reduced very much. Thus, even if the high frequency power or gas flow rate is increased to accelerate the film-deposition rate, the surface of the deposited film can be less damaged by ions and the film of a good quality can be grown at a higher rate. Furthermore, although contamination due to powder produced in a reaction chamber is liable to occur during film deposition under a high pressure condition, it hardly occurs when a material gas is diluted with a large amount of highly heat-conductive gas such as hydrogen.

The present invention can also provide crystalline silicon-based thin film 205 higher in quality than a conventional method can, as described below. Firstly, the high film-deposition rate permits only a reduced percentage of the impurity atoms of residual oxygen, nitrogen and the like in the reaction chamber to be taken into the film. Also, the reduced crystal-nucleus creation time in an initial period of film growth allows the nucleus density to be relatively reduced and then significantly oriented crystal grains of large sizes to be readily formed. Furthermore, film deposition under a high pressure allows defects at grain boundaries and in grains to be more readily passivated with hydrogen and also reduced in density.

On photoelectric conversion layer 205, a silicon-based thin film as a semiconductor layer 206 opposite in conductivity type to underlying layer 204 is deposited by a plasma CVD method. Silicon-based thin film 206 of the opposite conductivity type can be, e.g., a p-type silicon thin film doped with more than 0.01 at. % boron as a conductivity-type determining impurity or an n-type silicon thin film doped with more than 0.01 at. % phosphorus. However, impurity atoms for semiconductor layer 206 are not limited to the above ones and may also be, e.g., aluminum for a p-type silicon. Further, semiconductor layer 206 may also be formed of an alloy material such as silicon carbide or silicon germanium. Silicon-based thin film 206 of the opposite conductivity type may be polycrystalline, microcrystalline or amorphous and set to have a film thickness of 3 to 100 nm, more preferably 5 to 50 nm.

Formed on photoelectric conversion unit 211 is a transparent conductive oxide film 207 comprised of at least one layer selected, e.g., from ITO, $SnO_2$, ZnO, on which a comb-shaped metal electrode 208 is formed as a grid electrode through sputtering or vapor deposition, including at least one selected from Al, Ag, Au, Cu Pt and an alloy thereof. Thus, a silicon-based thin-film photoelectric conversion device of a polycrystalline type is completed, as shown in FIG. 1.

Figure 2:
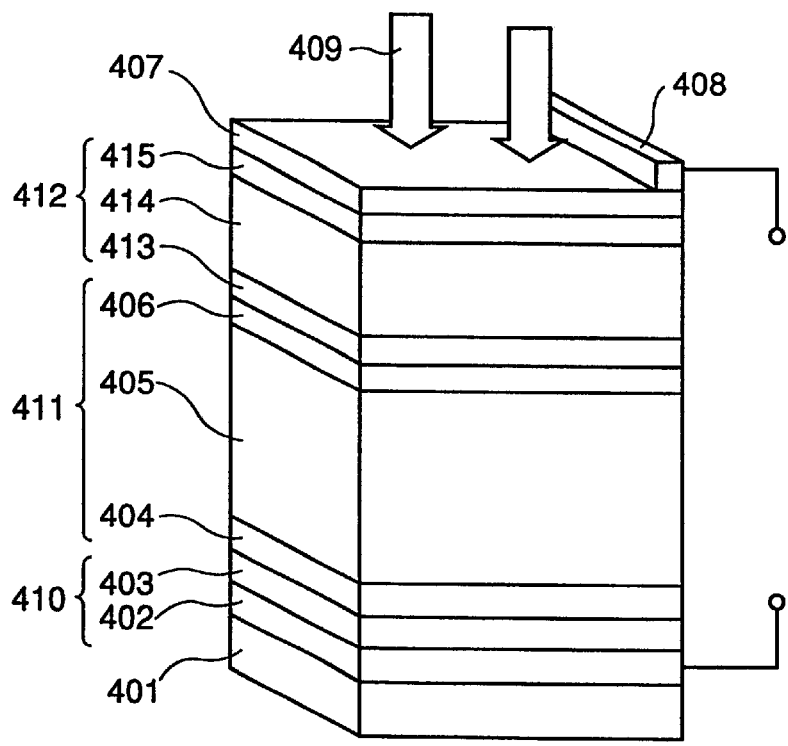
FIG. 2 is a schematic perspective view of a tandem silicon-based thin-film photoelectric conversion device of an amorphous-polycrystalline type according to another embodiment of the present invention.

FIG. 2 is a schematic perspective view of a silicon-based thin-film photoelectric conversion device of a tandem-type manufactured according to another embodiment of the present invention. In the FIG. 2 tandem photoelectric conversion device, a plurality of layers 402 to 406 are formed on a substrate 401, corresponding to the plurality of layers 202 to 206 formed on substrate 201 shown in FIG. 1.

In the FIG. 2 tandem photoelectric conversion device, however, a photoelectric conversion unit 412 of an amorphous type is also formed by a plasma CVD method on photoelectric conversion unit 411 of a polycrystalline type. Photoelectric conversion unit 412 of an amorphous type includes a microcrystalline or amorphous silicon-based thin film 413 of a first conductivity type, an amorphous silicon-based thin-film photoelectric conversion layer 414 of substantially an intrinsic semiconductor, and a microcrystalline or amorphous silicon-based thin film 415 of the opposite conductivity type that are successively stacked over photoelectric conversion unit 411 of a polycrystalline type.

Formed on photoelectric conversion unit 412 of an amorphous type are a front transparent electrode 407 and a comb-shaped metal electrode 408, corresponding to elements 207 and 208 shown in FIG. 1. Thus, a tandem photoelectric conversion device of an amorphous-polycrystalline type is completed, as shown in FIG. 2.

It is needless to say that the step of forming a crystalline photoelectric conversion layer (205, 405) requiring a large film thickness has been the most significant issue in enhancing throughput in the process for manufacturing a silicon-based thin-film photoelectric conversion device as described above. The present invention can much increase the deposition rate for the crystalline photoelectric conversion layer and also provide a film with a better quality. Thus the present invention can significantly contribute to enhancement of the performance of the device and to reduction of the cost for the same.

It is also needless to say that it is desirable to increase open-circuit voltage $V_{OC}$ for enhancing the photoelectric conversion efficiency of the polycrystalline-type photoelectric conversion device as shown in FIG. 1. According to the present invention, when a photoelectric conversion layer is being deposited, a distance between plasma discharge electrodes can be optimally increased with the crystal growth in the layer to increase open-circuit voltage $V_{OC}$ of a photoelectric conversion device to be obtained.

In the tandem photoelectric conversion device of an amorphous-polycrystalline type as shown in FIG. 2, amorphous-type photoelectric conversion unit 412, having a relatively low generating current density, will limit a short-circuit current density $J_{SC}$ of the entire device. In order for the device as a whole to obtain high photoelectric conversion efficiency, it is desirable that open-circuit voltage $V_{OC}$ of polycrystalline-type photoelectric conversion unit 411 be increased even if it would entail more or less sacrificing a relatively large $J_{SC}$ that can be provided by polycrystalline-type photoelectric conversion unit 411 itself. According to the present invention, when crystalline photoelectric conversion layer 405 is being deposited, a distance between plasma discharge electrodes can be optimally increased with the crystal growth in the layer so as to obtain polycrystalline-type photoelectric conversion unit 411 with high open-circuit voltage $V_{OC}$ and consequently enhance the conversion efficiency of the entirety of the tandem photoelectric conversion device. Increasing the inter-electrode distance can also serve to enhance the uniformity of the deposited film and also effectively further reduce film damage caused by plasma.

EXAMPLES

Hereinafter, silicon-based thin-film solar cells as silicon-based thin-film photoelectric conversion devices manufactured by exemplary methods according to the present invention will now be described together with solar cells manufactured by exemplary comparative methods.

Comparative Example 1

A polycrystalline-type silicon thin film solar cell similar to the FIG. 1 embodiment was fabricated as Comparative Example 1. On glass substrate 201, a back electrode 210 was to include an Ag film 202 of 300 nm thickness and a ZnO film 203 of 100 nm thickness thereon, each deposited by sputtering. Formed on back electrode 210 were a phosphorus-doped n-type microcrystalline silicon layer 204 of 30 nm thickness, a non-doped crystalline silicon photoelectric conversion layer 205 of 3 μm thickness, and a boron-doped p-type mycrocrystalline silicon layer 206 of 15 nm thickness, each deposited by a RF plasma CVD method, to form an n-i-p photoelectric conversion unit 211. On photoelectric conversion unit 211, a transparent conductive ITO film of 80 nm thickness as front electrode 207 was deposited by sputtering, and thereon comb-shaped Ag electrode 208 for taking out current was deposited by vapor deposition.

Crystalline silicon photoelectric conversion layer 205 was deposited by a RF plasma CVD method using a high frequency power supply of 13.56 MHz. In the method, a reaction gas of a mixture of silane and hydrogen was used at a silane to hydrogen flow ratio of 1/170, and a pressure of 7 Torr was maintained in the reaction chamber. The discharge electrodes were spaced by a constant distance of 10 mm, a discharging power density of 300 mW/cm$^2$ was applied, and a substrate temperature of 180° C. was also set.

When the silicon thin film solar cell of a polycrystalline type of Comparative Example 1 was irradiated with incident light 209 of AM1.5 at a light density of 100 mW/cm$^2$, resultant output characteristics thereof were an open-circuit voltage of 0.501V, a short-circuit current density of 22.9 mA/cm$^2$, a fill factor of 76.5%, and a conversion efficiency of 8.89%.

Example 1

In Example 1, a polycrystalline-type silicon thin film solar cell was fabricated similarly to Comparative Example 1. More specifically, Example 1 differs from Comparative Example 1 only in that after 30% of crystalline silicon photoelectric conversion layer 205 was deposited, the distance between the plasma discharge electrodes was increased gradually at a constant rate from 10 mm at the deposition initiation to 14 mm at the deposition completion.

When the polycrystalline-type silicon thin film solar cell of Example 1 was irradiated with light under the same conditions as Comparative Example 1, output characteristics thereof were an open-circuit voltage of 0.530V, a short-circuit current density of 21.3 mA/cm$^2$, a fill factor of 78.8%, and a conversion efficiency of 8.90%.

Although Example 1 is slightly lower in short-circuit current density than Comparative Example 1, the former is higher in open-circuit voltage than the latter and it is apparent that the Example 1 has been enhanced totally in conversion efficiency. Furthermore, Example 1 has also been enhanced in the uniformity of the photoelectric conversion layer, with positional variations in conversion efficiency being less by approximately 5% than those in Comparative Example 1.

Comparative Example 2

A tandem thin film solar cell of an amorphous-crystalline type corresponding to FIG. 2 was fabricated as Comparative Example 2. The tandem solar cell of Comparative Example 2 included polycrystalline-type photoelectric conversion unit 411 fabricated under the same conditions as polycrystalline-type photoelectric conversion unit 211 of Comparative Example 1. On polycrystalline-type photoelectric conversion unit 411, amorphous-type photoelectric conversion unit 412 was fabricated according to conventional method under conventional conditions.

When the tandem solar cell of Comparative Example 2 was irradiated with light 409 under the same conditions as Comparative Example 1, output characteristics thereof were an open-circuit voltage of 1.33V, a short-circuit current density of 13.3 mA/cm$^2$, a fill factor of 73.6%, and a conversion efficiency of 13.0%.

Example 2

In Example 2, a tandem solar cell was fabricated under conditions similar to those for Comparative Example 2, except that polycrystalline-type photoelectric conversion unit 411 was fabricated under the same conditions as those for Example 1. When the tandem solar cell of Example 2 was irradiated with light under conditions similar to those for Comparative Example 2, output characteristics thereof were an open-circuit voltage of 1.37V, a short-circuit current density of 13.4 mA/cm$^2$, a fill factor of 73.6%, and a conversion efficiency of 13.5%.

As is apparent from Comparative Examples 1 and 2, stacking a general amorphous-type photoelectric conversion unit on a polycrystalline-type photoelectric conversion unit results in short-circuit current density being affected by the amorphous-type photoelectric conversion unit and thus reduced to 13.3 mA/cm$^2$. In Example 2, in contrast, an amorphous-type photoelectric conversion unit is stacked on the polycrystalline-type photoelectric conversion unit of Example 1 higher in open-circuit voltage than that of Comparative Example 1, resulting in an open-circuit voltage higher than that of Comparative Example 2 and hence a resultant, clearly improved conversion efficiency as compared to that of Comparative Example 2. Furthermore, positional variations in conversion efficiency in Example 2 were also approximately 5% less than those in Comparative Example 2.

Example 3

In Example 3, a polycrystalline-type silicon thin film solar cell similar to Comparative Example 1 was fabricated. More specifically, the deposition of crystalline silicon photoelectric conversion layer 205 is started under a reactive-gas pressure of 7 Torr which is then increased at a constant rate after 20% completion of the deposition and the deposition is completed when the pressure has attained 8 Torr. Except for this condition, the present example is exactly the same as Comparative Example 1 in the film depositing conditions for the other layers and in the device configuration.

When the polycrystalline-type silicon thin film solar cell of Example 3 was irradiated with light under the same conditions as those for Comparative Example 1, output characteristics thereof were an open-circuit voltage of 0.523V, a short-circuit current density of 21.5 mA/cm$^2$, a fill factor of 80.1%, and a conversion efficiency of 9.03%.

Although Example 3 is slightly lower in short-circuit current density than Comparative Example 1, the former is higher in open-circuit voltage than the latter and it is apparent that Example 3 has been enhanced totally in conversion efficiency.

Comparative Example 3

In Comparative Example 3, a polycrystalline-type silicon thin film solar cell was fabricated similarly to Comparative Example 1, except that a constant gas pressure of 10 Torr was maintained during the deposition of crystalline silicon photoelectric conversion layer 205. When the polycrystalline-type silicon thin film solar cell of Comparative Example 3 was irradiated with light under conditions similar to those for Comparative Example 1, output characteristics thereof were an open-circuit voltage of 0.518V, a short-circuit current density of 27.2 mA/cm², a fill factor of 74.3%, and a conversion efficiency of 10.5%.

Comparative Example 4

In Comparative Example 4, a polycrystalline-type silicon thin film solar cell was fabricated under conditions similar to those for Comparative Example 1, except that a constant gas pressure of 12 Torr was maintained during the deposition of crystalline silicon photoelectric conversion layer 205. When the polycrystalline-type silicon thin film solar cell of Comparative Example 4 was irradiated with light under conditions similar to those for Comparative Example 3, output characteristics thereof were an open-circuit voltage of 0.721V, a short-circuit current density of 15.3 mA/cm², a fill factor of 58.8%, and a conversion efficiency of 6.5%.

The reduction in conversion efficiency in Comparative Example 4 may be because the ratio of the amorphous phase contained in crystalline photoelectric conversion layer 205 has been increased by maintaining a relatively higher gas pressure since the initiation of the deposition of crystalline photoelectric conversion layer 205 than that applied in Comparative Example 3.

Example 4

In Example 4, a polycrystalline-type silicon thin film solar cell was fabricated under similar conditions to those for Comparative Examples 3 and 4, except that the deposition of crystalline silicon photoelectric conversion layer 205 is started under a gas pressure of 10 Torr which is increased at a constant rate following 20% completion of the deposition and it is completed when the gas pressure has attained 12 Torr. When the polycrystalline-type silicon thin film solar cell of Example 4 was irradiated with light under the same conditions as those for Comparative Examples 3 and 4, output characteristics thereof were an open-circuit voltage of 0.547V, a short-circuit current density of 25.1 mA/cm², a fill factor of 73.2%, and a conversion efficiency of 10.1%.

As seen from comparison with Comparative Examples 3 and 4, in Example 4 the gas pressure is increased to 12 Torr by the time of the deposition completion of photoelectric conversion layer 205 but initially set at the lower pressure of 10 Torr at the initiation of the deposition and thus the crystal growth in the photoelectric conversion layer can be made more preferable one. Then, it is understood that as a result, open-circuit voltage is distinctly improved as compared with Comparative Example 3, while photoelectric conversion efficiency is hardly reduced. It is also seen that the open-circuit voltage in Example 4 is further increased as compared to that in Example 3.

Comparative Example 5

A tandem thin film solar cell of an amorphous-crystalline type corresponding to FIG. 2 was fabricated as Comparative Example 5. The tandem solar cell of Comparative Example 5 included polycrystalline-type photoelectric conversion unit 411 fabricated under the same conditions as polycrystalline-type photoelectric conversion unit 211 of Comparative Example 3. On polycrystalline-type photoelectric conversion unit 411, amorphous-type photoelectric conversion unit 412 was fabricated according to conventional method under conventional conditions.

When the tandem solar cell of Comparative Example 5 was irradiated with light 409 under the same conditions as Comparative Example 1, output characteristics thereof were an open-circuit voltage of 1.34V, a short-circuit current density of 13.3 mA/cm², a fill factor of 73.2%, and a conversion efficiency of 13.0%.

Example 5

In Example 5, a tandem solar cell was fabricated under conditions similar to those for Comparative Example 5, except that polycrystalline-type photoelectric conversion unit 411 was fabricated under the same conditions as those in Example 4. When the tandem solar cell of Example 5 was irradiated with light under conditions similar to those for Comparative Example 5, output characteristics thereof were an open-circuit voltage of 1.37V, a short-circuit current density of 13.3 mA/cm², a fill factor of 73.1%, and a conversion efficiency of 13.3%.

As is apparent from Comparative Examples 3 and 5 and Examples 4 and 5, stacking a general amorphous-type photoelectric conversion unit on a polycrystalline-type photoelectric conversion unit results in short-circuit current density being affected by the amorphous-type photoelectric conversion unit and thus reduced to 13.3 mA/cm². In Example 5, in contrast, an amorphous-type photoelectric conversion unit is stacked on the polycrystalline-type photoelectric conversion unit of Example 4 higher in open-circuit voltage than that of Comparative Example 3, resulting in an open-circuit voltage higher than that of Comparative Example 5 and hence a resultant, clearly improved conversion efficiency.

Example 6

In Example 6, a polycrystalline-type silicon thin film solar cell similar to Comparative Example 1 was fabricated. More specifically, in Example 6 the deposition of photoelectric conversion layer 205 is started under a reactive-gas pressure of 7 Torr with a flow ratio of silane to hydrogen of 1/170 which is then varied by increasing the flow rate of silane at a constant rate following 30% completion of the deposition to attain a flow ratio of 1.2/170 when the deposition is completed. Except for this condition, Example 6 is exactly the same as Comparative Example 1 in the film depositing conditions for the other layers and in the device configuration, though the time required for depositing photoelectric conversion layer 205 of the same thickness as in Comparative Example 1 was able to be approximately 5% shorter in Example 6 than in Comparative Example 1.

When the polycrystalline-type silicon thin film solar cell of Example 6 was irradiated with light under the same conditions as those for Comparative Example 1, output characteristics thereof were an open-circuit voltage of 0.538V, a short-circuit current density of 21.3 mA/cm², a fill factor of 78.3%, and a conversion efficiency of 8.97%.

Although Example 6 is slightly lower in short-circuit current density than Comparative Example 1, the former is higher in open-circuit voltage than the latter and it is apparent that Example 6 has been distinctly enhanced totally in conversion efficiency.

Example 7

In Example 7, a tandem solar cell was fabricated under conditions similar to those for Comparative Example 2, except that polycrystalline-type photoelectric conversion unit 411 was fabricated under the same conditions as those in Example 6. When the tandem solar cell of Example 7 was irradiated with light under conditions similar to those for Comparative Example 2, output characteristics thereof were an open-circuit voltage of 1.38V, a short-circuit current density of 13.3 mA/cm$^2$, a fill factor of 73.0%, and a conversion efficiency of 13.4%.

As is apparent from Comparative Examples 1 and 2, stacking a general amorphous-type photoelectric conversion unit on a polycrystalline-type photoelectric conversion unit results in short-circuit current density being affected by the amorphous-type photoelectric conversion unit and thus reduced to 13.3 mA/cm$^2$. In Example 7, in contrast, an amorphous-type photoelectric conversion unit is stacked on the polycrystalline-type photoelectric conversion unit of Example 6 higher in open-circuit voltage than that of Comparative Example 1, resulting in an open-circuit voltage higher than that of Comparative Example 2 and hence a resultant, clearly improved conversion efficiency.

Example 8

In Example 8 a polycrystalline-type silicon thin film solar cell similar to that of Comparative Example 1 was fabricated. More specifically, the former differs from the latter only in that a plasma discharging power density is provided which is set to 300 mW/cm$^2$ initially in starting the deposition of the crystalline silicon photoelectric conversion layer 205 and thereafter, following 30% completion of the deposition, the plasma discharging power density is decreased continuously at a constant rate to 280 mW/cm$^2$ until the deposition is thoroughly completed.

When the polycrystalline-type silicon thin film solar cell of Example 8 was irradiated with light under the same conditions as those for Comparative Example 1, output characteristics thereof were an open-circuit voltage of 0.534V, a short-circuit current density of 21.5 mA/cm$^2$, a fill factor of 78.9%, and a conversion efficiency of 9.06%.

Although Example 8 is slightly lower in short-circuit current density than Comparative Example 1, the former is higher in open-circuit voltage than the latter and it is apparent that Example 8 has been distinctly enhanced totally in conversion efficiency.

Example 9

In Example 9, a tandem solar cell was fabricated under conditions similar to those for Comparative Example 2, except that polycrystalline-type photoelectric conversion unit 411 was fabricated under the same conditions as those in Example 8. When the tandem solar cell of Example 9 was irradiated with light under conditions similar to those for Comparative Example 2, output characteristics thereof were an open-circuit voltage of 1.38V, a short-circuit current density of 13.4 mA/cm$^2$, a fill factor of 73.8%, and a conversion efficiency of 13.6%.

As is apparent from Comparative Examples 1 and 2, stacking a general amorphous-type photoelectric conversion unit on a polycrystalline-type photoelectric conversion unit results in short-circuit current density being affected by the amorphous-type photoelectric conversion unit and thus reduced to 13.3 mA/cm$^2$. In Example 9, in contrast, an amorphous-type photoelectric conversion unit is stacked on the polycrystalline-type photoelectric conversion unit of Example 8 higher in open-circuit voltage than that of Comparative Example 1, resulting in an open-circuit voltage higher than that of Comparative Example 2 and hence a resultant, clearly improved conversion efficiency.

Thus according to the present invention, when a crystalline silicon-based photoelectric conversion layer is formed on an inexpensive substrate by a plasma CVD method at a low temperature, it becomes possible to provide a much higher film-deposition rate and a better film-quality than conventional to significantly contribute to both enhancement in the performance of a silicon-based thin film photoelectric conversion device and reduction in the cost for the same.

In particular, when a crystalline photoelectric conversion layer is being grown, the distance between plasma discharge electrodes may be optimally increased, the pressure of a reactive gas may be optimally increased, the ratio of silane gas in the reactive gas may be optimally increased or the plasma discharging power density may be optimally reduced to enhance an open-circuit voltage of a photoelectric conversion device to be obtained as a final product and also to further reduce film damage caused by plasma and enhance the uniformity of the film. This can be particularly advantageous in fabricating a tandem silicon-based thin-film photoelectric conversion device of an amorphous-polycrystalline type, with the enhanced open-circuit voltage contributing to improving the photoelectric conversion efficiency of the entire device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a silicon-based thin-film photoelectric conversion device comprising at least one polycrystalline-type photoelectric conversion unit over a substrate, the photoelectric conversion unit including a semiconductor layer of a first conductivity type, a crystalline silicon-based photoelectric conversion layer and a semiconductor layer of an opposite conductivity type successively deposited by a plasma CVD process, said method comprising applying a plasma CVD process to deposit said crystalline photoelectric conversion layer during which a temperature of an underlying layer is less than 500° C, a pressure in a plasma reaction chamber is more than 5 Torr, and a gas introduced into said plasma reaction chamber contains a silane-type gas and hydrogen gas as main components, said hydrogen gas being more than 50 times larger in flow rate than said silane-type gas;

wherein the plasma CVD process for depositing the crystalline photoelectric conversion layer includes an operation of increasing a distance between plasma discharge electrodes of the plasma reaction chamber so that said distance is at most one centimeter larger when said photoelectric conversion layer has been completely deposited than when said photoelectric conversion layer starts to be deposited, said distance being increased gradually or in steps after said photoelectric conversion layer has been deposited to 20 to 80% of its final thickness.

2. The method of claim 1, wherein said crystalline photoelectric conversion layer is a crystalline silicon film with a crystallized volume fraction of more than 80% capable of being formed with the underlying layer at a temperature in a range of 100 to 400° C., containing hydrogen of 0.1 to 20 at. %, and having a film thickness in a range of 0.5 to 10 µm.

3. The method of claim 1, wherein a plasma discharging power density of more than 100 m W/cm$^2$ is applied when the crystalline photoelectric conversion layer is deposited.

4. The method of claim 1, wherein at least one amorphous-type photoelectric conversion unit is stacked over said at least one polycrystalline-type photoelectric conversion unit, said at least one amorphous-type photoelectric conversion unit includes a semiconductor layer of a first conductivity type, an amorphous silicon-based photoelectric conversion layer, and a semiconductor layer of an opposite conductivity type successively deposited by a plasma CVD process.

5. A method of fabricating a silicon-based thin-film photoelectric conversion device comprising at least one polycrystalline-type photoelectric conversion unit over a substrate, the photoelectric conversion unit including a semiconductor layer of a first conductivity type, a crystalline silicon-based photoelectric conversion layer and a semiconductor layer of an opposite conductivity type successively deposited by a plasma CVD process, the method comprising applying a plasma CVD process to deposit the crystalline photoelectric conversion layer during which a temperature of an underlying layer is less than 500° C., a pressure in a plasma reaction chamber is more than 5 Torr, and a gas introduced into the plasma reaction chamber contains a silane-type gas and hydrogen gas as main components, said hydrogen gas being more than 50 times larger in flow rate than said silane-type gas;

wherein the plasma CVD process for depositing the crystalline photoelectric conversion layer includes an operation of providing in said reaction chamber a first pressure of more than 5 Torr when said photoelectric conversion layer starts to be deposited, and increasing said pressure gradually or in steps to a second pressure until said photoelectric conversion layer is completely deposited.

6. The method of claim 5, wherein the crystalline photoelectric conversion layer is a crystalline silicon film with a crystallized volume fraction of more than 80% capable of being formed with the underlying layer at a temperature in a range of 100 to 400° C., containing hydrogen of 0.1 to 20 at. %, and having a film thickness in a range of 0.5 to 10 $\mu$m.

7. The method of claim 5, wherein a plasma discharging power density of more than 100 m W/cm$^2$ is applied when the crystalline photoelectric conversion layer is deposited.

8. The method of claim 5, wherein at least one amorphous-type photoelectric conversion unit is stacked over said at least one polycrystalline-type photoelectric conversion unit, said at least one amorphous-type photoelectric conversion unit includes a semiconductor layer of a first conductivity type, an amorphous silicon-based photoelectric conversion layer, and a semiconductor layer of an opposite conductivity type successively deposited by a plasma CVD process.

9. A method of fabricating a silicon-based thin-film photoelectric conversion device comprising at least one polycrystalline-type photoelectric conversion unit over a substrate, the photoelectric conversion unit including a semiconductor layer of a first conductivity type, a crystalline silicon-based photoelectric conversion layer and a semiconductor layer of an opposite conductivity type successively deposited by a plasma CVD process, the method comprising applying a plasma CVD process to deposit the crystalline photoelectric conversion layer during which a temperature of an underlying layer is less than 500° C., a pressure in a plasma reaction chamber is more than 5 Torr, and a gas introduced into the plasma reaction chamber contains a silane-type gas and hydrogen gas as main components, said hydrogen gas being more than 50 times larger in flow rate than said silane-type gas;

wherein the plasma CVD process for depositing the crystalline photoelectric conversion layer includes an operation of providing said silane-type gas of a flow rate 1.1 to 1.5 times larger when said photoelectric conversion layer has been completely deposited than when said photoelectric conversion layer starts to be deposited, said flow rate of said silane-type gas being gradually increased for more than half a time required for depositing said photoelectric conversion layer.

10. The method of claim 9, wherein the crystalline photoelectric conversion layer is a crystalline silicon film with a crystallized volume fraction of more than 80% capable of being formed with the underlying layer at a temperature in a range of 100 to 400° C., containing hydrogen of 0.1 to 20 at. %, and having a film thickness in a range of 0.5 to 10 $\mu$m.

11. The method of claim 9, wherein a plasma discharging power density of more than 100 m W/cm$^2$ is applied when the crystalline photoelectric conversion layer is deposited.

12. The method of claim 9, wherein at least one amorphous-type photoelectric conversion unit is stacked over said at least one polycrystalline-type photoelectric conversion unit, said at least one amorphous-type photoelectric conversion unit includes a semiconductor layer of a first conductivity type, an amorphous silicon-based photoelectric conversion layer, and a semiconductor layer of an opposite conductivity type successively deposited by a plasma CVD process.

13. A method of fabricating a silicon-based thin-film photoelectric conversion device comprising at least one polycrystalline-type photoelectric conversion unit over a substrate, the photoelectric conversion unit including a semiconductor layer of a first conductivity type, a crystalline silicon-based photoelectric conversion layer and a semiconductor layer of an opposite conductivity type successively deposited by a plasma CVD process, the method comprising applying a plasma CVD process to deposit the crystalline photoelectric conversion layer during which a temperature of an underlying layer is less than 500° C., a pressure in a plasma reaction chamber is more than 5 Torr, and a gas introduced into the plasma reaction chamber contains a silane-type gas and hydrogen gas as main components, said hydrogen gas being more than 50 times larger in flow rate than said silane-type gas;

wherein the plasma CVD process for depositing the crystalline photoelectric conversion layer includes an operation of providing a plasma discharging power density of more than 100 mW/cm$^2$, said plasma discharging power density being at most 15% smaller when said photoelectric conversion layer has been completely deposited than when said photoelectric conversion layer starts to be deposited, said plasma discharging power density being reduced gradually or in steps after said photoelectric conversion layer has been deposited to 20 to 80% of its final thickness.

14. The method of claim 13, wherein the crystalline photoelectric conversion layer is a crystalline silicon film with a crystallized volume fraction of more than 80% capable of being formed with the underlying layer at a temperature in a range of 100 to 400° C., containing hydrogen of 0.1 to 20 at. %, and having a film thickness in a range of 0.5 to 10 $\mu$m.

15. The method of claim 13, wherein at least one amorphous-type photoelectric conversion unit is stacked over said at least one polycrystalline-type photoelectric conversion unit, said at least one amorphous-type photoelectric conversion unit includes a semiconductor layer of a first conductivity type, an amorphous silicon-based photoelectric conversion layer, and a semiconductor layer of an opposite conductivity type successively deposited by a plasma CVD process.

* * * * *